(12) United States Patent
Kajiura (10) Patent No.: US 6,426,874 B2
(45) Date of Patent: Jul. 30, 2002

(54) SEMICONDUCTOR DEVICE MOUNTING STRUCTURE AND FEEDING-SIDE CHARGER WITH HEAT RADIATING UNIT

(75) Inventor: Katsuyuki Kajiura, Kariya (JP)

(73) Assignee: Kabushiki Kaisha Toyoda Jidoshokki Seisakusho, Kariya (JP)

( * ) Notice: Subject to any disclaimer, the term of this patent is extended or adjusted under 35 U.S.C. 154(b) by 0 days.

(21) Appl. No.: 09/730,016

(22) Filed: Dec. 5, 2000

(30) Foreign Application Priority Data

Dec. 10, 1999 (JP) .......................................... 11-352082

(51) Int. Cl.[7] .................................................. H05K 7/20
(52) U.S. Cl. ........................ 361/700; 361/687; 361/704; 361/732; 257/707; 165/80.3
(58) Field of Search ................................ 361/683, 690, 361/687–688, 692, 695, 700–710, 714–718, 737, 719–722; 165/80.3, 185, 104.26, 104.33, 104.34, 80.2, 80.4; 174/16.3, 52.2, 16.1; 257/706–727, 796, 787–789, 791

(56) References Cited

U.S. PATENT DOCUMENTS

| | | | | |
|---|---|---|---|---|
| 4,120,019 A | * | 10/1978 | Arii et al. | .................... 361/385 |
| 5,331,510 A | * | 7/1994 | Ouchi et al. | ................. 361/702 |
| 5,409,055 A | * | 4/1995 | Tanaka et al. | .......... 165/104.33 |
| 5,461,299 A | | 10/1995 | Bruni | ............................ 320/2 |
| 5,510,956 A | * | 4/1996 | Suzuki | ......................... 361/704 |
| 5,946,188 A | * | 8/1999 | Rochel et al. | .............. 361/690 |
| 6,082,433 A | * | 7/2000 | Yamamoto et al. | ..... 165/104.26 |

* cited by examiner

*Primary Examiner*—Leo P. Picard
*Assistant Examiner*—Michael Datskovsky
(74) *Attorney, Agent, or Firm*—Woodcock Washburn LLP (57) ABSTRACT

In a feeding-side charger, a heat transfer unit (23), which comes into contact with a heat radiating duct (16) fixed with a power circuit board (18), is fixed to the power circuit board (18) in which a power conversion circuit is formed. Each main body (22) of a plurality of MOSFETs (21) mounted on the power circuit board (18) comes into contact with the heat transfer unit (23) with a silicone sheet (24) being interposed therebetween.

5 Claims, 7 Drawing Sheets

SEMICONDUCTOR DEVICE MOUNTING STRUCTURE AND FEEDING-SIDE CHARGER WITH HEAT RADIATING UNIT

BACKGROUND OF THE INVENTION

1. Field of the Invention

The present invention relates to a mounting structure for semiconductor devices such as power MOSFETs and a feeding-side charger comprising the semiconductor device mounting structure.

2. Description of the Prior Art

A conventional electromagnetic induction system feeding-side charger, such as one used to charge a battery of an electric automobile, comprises a power circuit board having formed therein a power conversion circuit for converting a commercial alternating current to a high-voltage high-frequency alternating current. The power conversion circuit comprises, for example, a rectification/power factor improving circuit and a resonance converter. The resonance converter is constituted by four (4) or eight (8) bridge connected power MOSFETs.

As is known, MOSFETs generate much heat when they are in operation. Therefore the MOSFETs are mounted on a heat radiating unit fixed on a circuit board. The heat radiating unit is made of, for example, an aluminum alloy and is provided with heat radiating fins for radiating heat, transferred from the MOSFETS, to the atmosphere. The radiating unit continues to cool the MOSFETs by radiating heat transferred from the MOSFETs to the atmosphere. In order to secure a sufficient heat radiating capacity from heat radiating fins, the mounting area of a heat radiating unit is designed to be remarkably larger than the mounting area of the MOSFET main bodies.

On the other hand, since smaller feeding-side chargers have been demanded, there is now a demand for smaller power circuit boards which govern the size of a feeding-side charger. This has triggered a demand for the reduction in mounting area of the heat radiating unit of MOSFETs whose mounting area occupies a large portion on a circuit board.

However, when a heat radiating unit having a smaller mounting area is used, the MOSFETs mounted thereon cannot be cooled sufficiently, and the mounting density of the MOSFETs cannot be increased. Due to this, the mounting area of the power MOSFETs cannot be reduced. These problems apply not only to a case where a plurality of MOSFETs are mounted but also to a case where a single power semiconductor device is mounted.

SUMMARY OF THE INVENTION

The present invention was made with a view to solving the above problems and the object thereof is to provide a semiconductor device mounting structure which can improve the cooling efficiency of semiconductor devices, relative to the mounting area thereof on a circuit board, so as to increase the mounting density of semiconductor devices, and a feeding-side charger provided with the same mounting structure of a semiconductor device.

With a view to solving the above problems, according to a first aspect of the present invention, there is provided a semiconductor device mounting structure wherein a heat transfer unit, which comes into contact with a heat radiating unit installed contiguously with the circuit board, is fixed to a circuit board on which semiconductor devices are mounted, and wherein the main bodies of the semiconductor devices mounted on the circuit board come into contact with the heat transfer unit.

According to the first aspect of the present invention, heat generated in the main bodies of the semiconductor devices when they are put in operation is transferred to the heat transfer unit, with which the main bodies of the semiconductor devices come into contact, and is then transferred therefrom to the heat radiating unit for radiation therefrom. Thus, when compared with the conventional mounting structure, in which heat from semiconductor devices is radiated by a heat radiating unit directly connected on a circuit board, since heat from semiconductor devices according to the mounting structure of the present invention is radiated by the heat radiating unit having a great heat radiating capacity, which can be provided irrespective of the mounting area on a circuit board, the heat radiating capacity per mounting area for mounting the heat transfer unit replacing the conventional heat radiating unit, on a circuit board, can be increased.

The present invention may be more fully understood from the description of the preferred embodiments of the invention, which will be described below, together with the accompanying drawings.

DESCRIPTION OF THE PREFERRED EMBODIMENTS

Referring to FIGS. 1 to 9, an embodiment of the present invention will be described, below, in which the present invention is embodied into a power semiconductor device mounted on a power circuit board provided in an electromagnetic induction system feeding-side charger.

Figure 2:
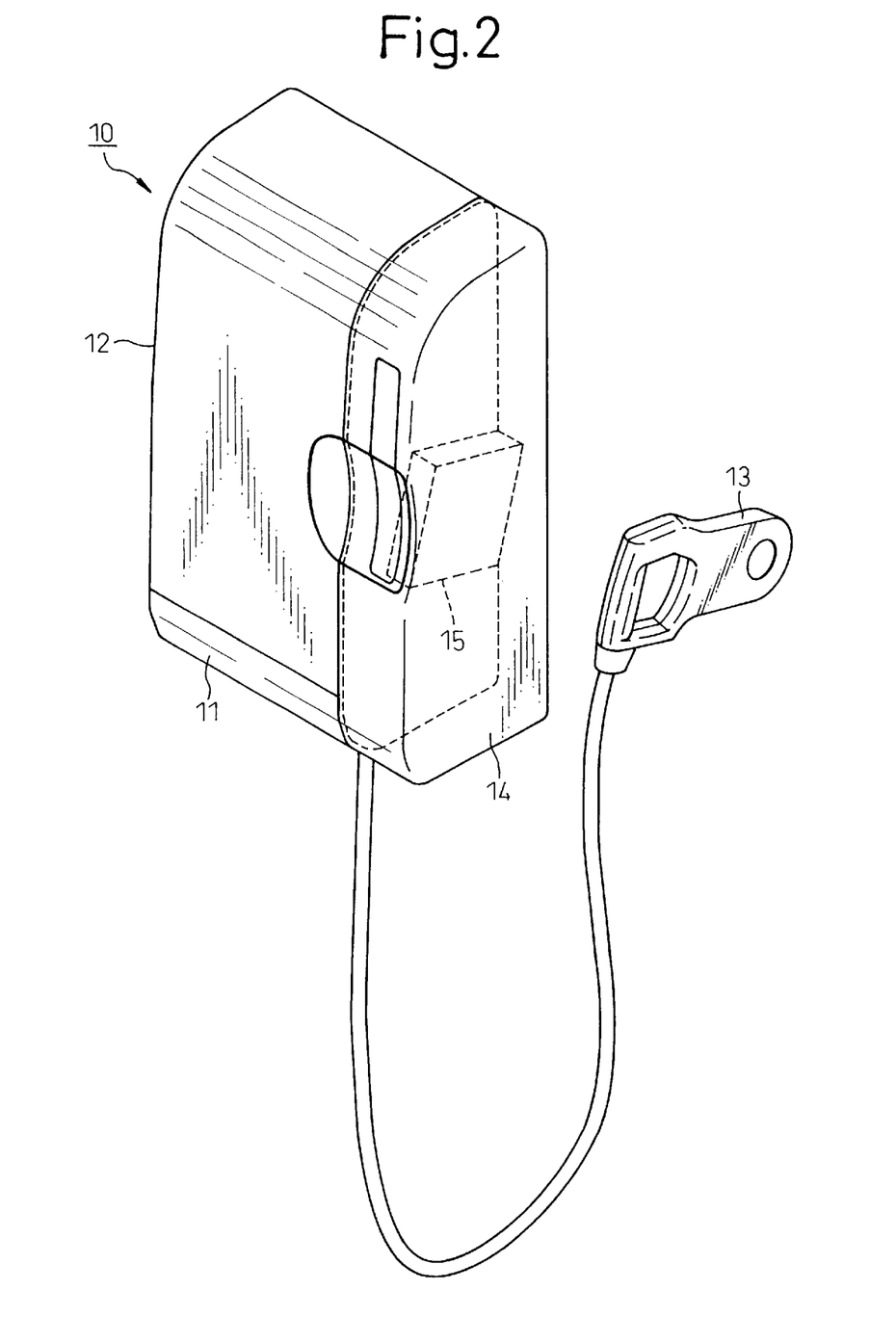
FIG. 2 is a perspective view showing a typical feeding-side charger.

The electromagnetic induction system charger comprises, as shown in FIG. 2, a feeding-side charger 10 installed in a specified charging area and a receiving-side charger installed in a vehicle and not shown. The feeding-side charger 10 converts a commercial alternating current to an alternating current of high voltage and high frequency and supplies electricity to the receiving-side charger by electromagnetic induction. The receiving-side charger converts an alternating current of high frequency, supplied from the feeding-side charger by electromagnetic induction, to a direct current and charges batteries.

As shown in FIG. 2, the main body of a feeding-side charger 10 is constituted by a lower frame 11 and a main body cover 12 adapted to cover an upper portion of the lower frame 11. The feeding-side charger 10 comprises a feeding coupler 13 adapted to connect to a receiving-side charger. A coupler accommodating portion 15 covered with a coupler cover 14 is provided on a side face of the main body.

Figure 3:
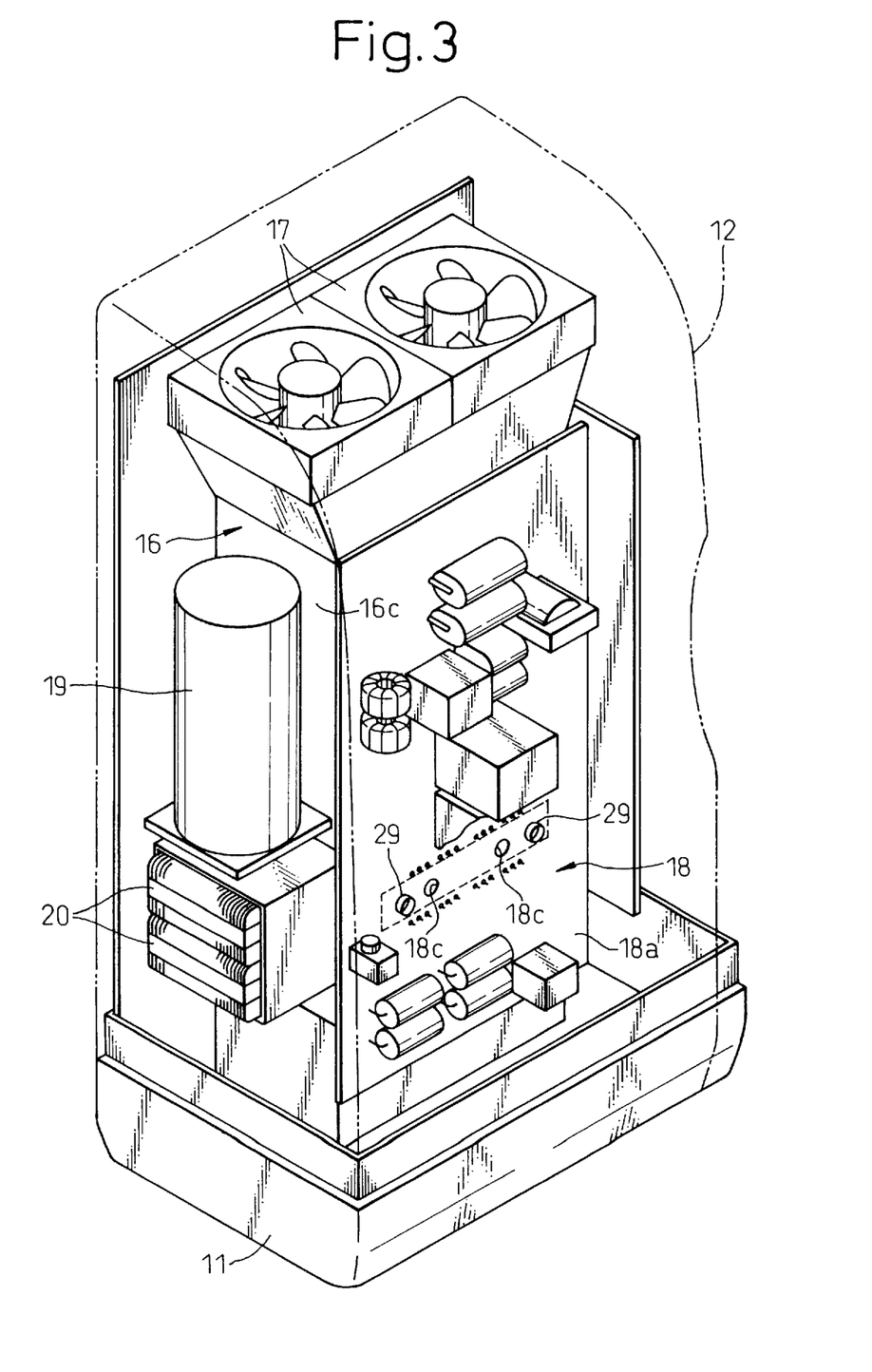
FIG. 3 is a diagrammatic perspective view showing the interior of a main body of the same charger.

As shown in FIG. 3, a heat radiating duct 16 as a vertically extending heat radiating unit is fixed to a rear part of a bottom face of the lower frame 11 in the interior of the main body of the feeding-side charger 10. The heat radiating duct 16, inside which a plurality of heat radiating fins 16a (shown in FIG. 1) are provided, is made of an aluminum alloy. The lower end opening of the heat radiating duct 16 communicates with the outside through an exhaust opening, which is provided in the bottom of the lower frame 11 and is not shown, and electric fans 17 are provided on an upper end opening thereof to supply air into the heat radiating duct 16.

The electric fans 17 introduce outside air into the main body cover 12 from an intake opening, which is not shown and is provided in a front part of the bottom of the lower frame 11, and the outside air passes through the outside of a front face 16b of the heat radiating duct 16 and then is supplied into the heat radiating duct 16.

Figure 1:
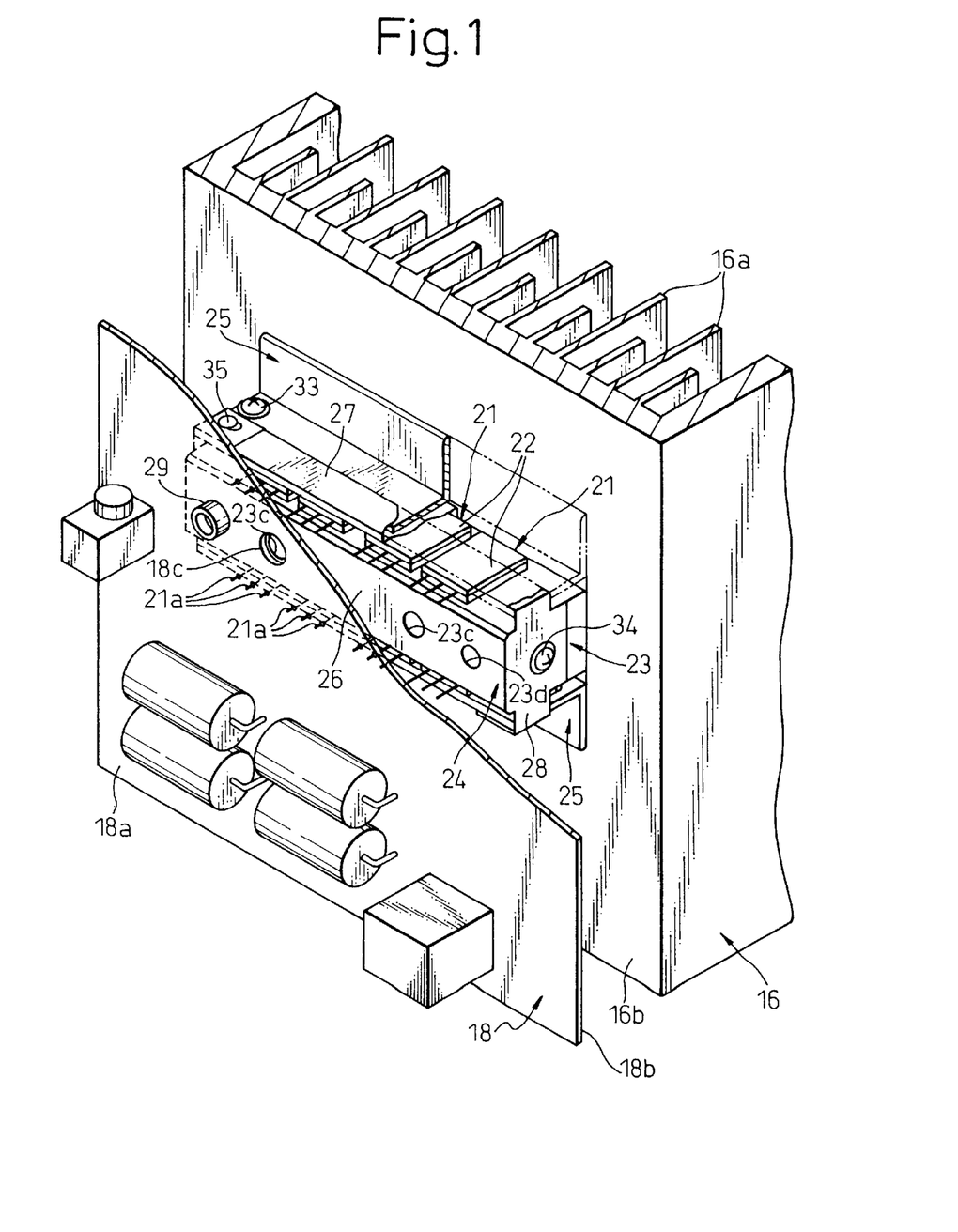
FIG. 1 is a diagrammatic perspective view showing a typical mounting structure for MOSFETs.

A power circuit board 18 is fixed to the front side of the heat radiating duct 16. A power conversion circuit, which converts a commercial alternating current into an alternating current of high voltage and high frequency, is provided on the power circuit board 18. The power conversion circuit has a rectification/power factor improving circuit and a resonant converter. The rectification/power factor improving circuit comprises a smoothing electrolytic condenser 19. The resonance converter comprises a bridge circuit comprising power MOSFETs 21 (shown in FIGS. 1, 4), as semiconductor devices and power semiconductor devices, which are connected to each other in parallel, and resonance coils 20. The smoothing electrolytic condenser 19 and the resonance coils 20 are fixed to a side face 16c of the heat radiating duct 16. As shown in FIG. 1, respective electronic components other than the smoothing electrolytic condenser 19 of the rectification/power factor improving circuit are mounted on a front face 18a of the power circuit board 18.

As shown in FIG. 1, the eight (8) MOSFETs 21 constituting the bridge circuit are of a molded type and are mounted on a back face 18b of the power circuit board 18. To be specific, the respective MOSFETs 21 are mounted by soldering the terminals 21a thereof to the board 18 so that main bodies 22 of the respective MOSFETs 21 are erect on the back face 18b of the power circuit board 18. Note that respective electronic components of the power conversion circuit other than the resonance coils 20 and the respective MOSFETs 21 are mounted on a front face 18a of the power circuit board 18.

Figure 4:
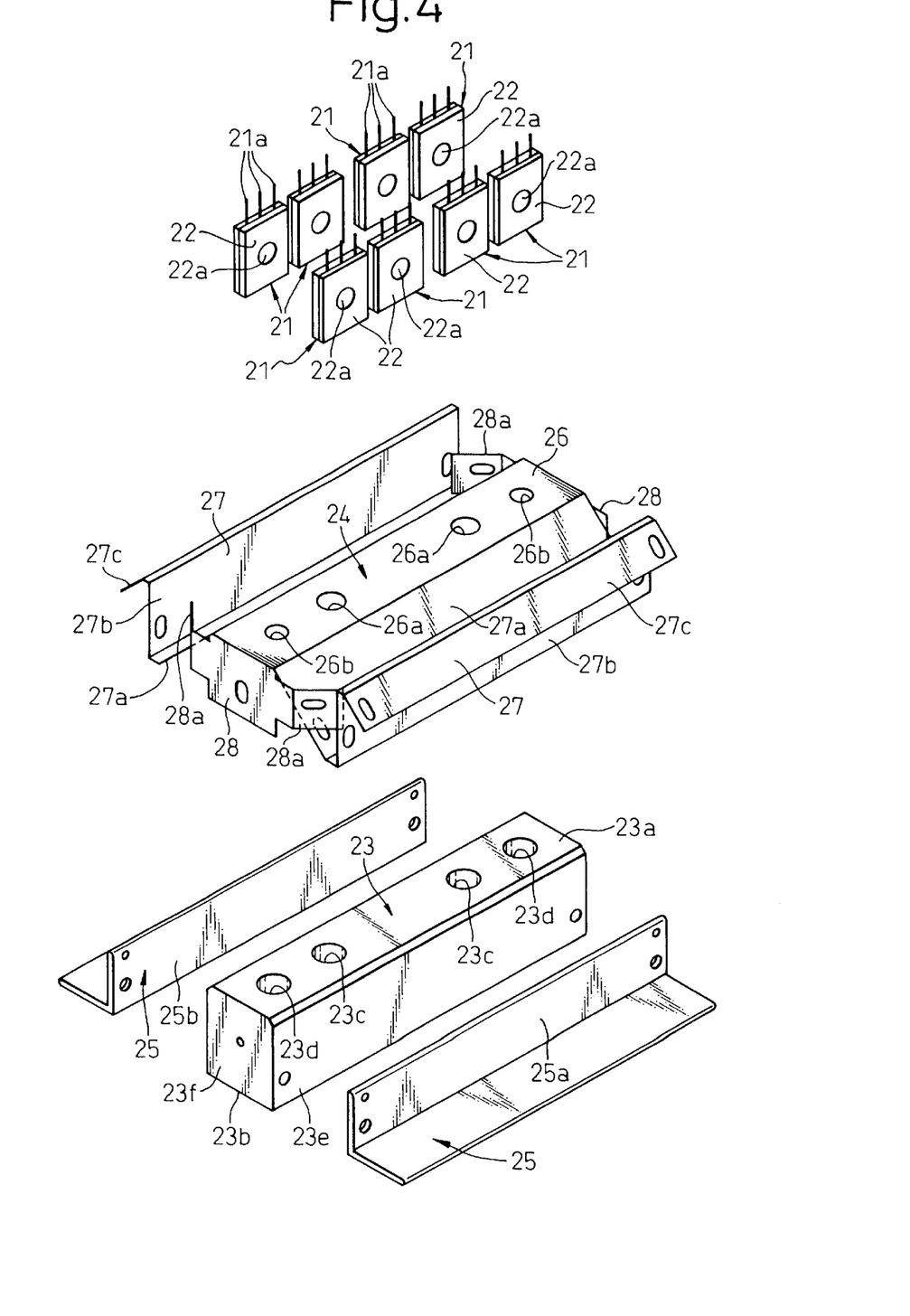
FIG. 4 is an exploded perspective view showing a MOSFET mounting structure.

A heat transfer unit 23 is fixed to the area of the back face 18b side of the power circuit board 18, on which the respective MOSFETs 21 are mounted, with a silicone sheet 24 functioning as an insulation sheet being interposed therebetween. As shown in FIG. 4, the heat transfer unit 23 is made of a block of aluminum alloy and formed into a rectangular prism-like configuration extending along the power circuit board 18. A second fixing face 23b of the heat transfer unit 23, which is opposite to a first fixing face 23a that functions as a fixing face coming into contact with the back face 18b of the power circuit board 18, comes into contact with the front face 16b of the heat radiating duct 16. Further, provided in the first fixing face 23a are a pair of first fixing holes 23c and a pair of second fixing holes 23d.

Furthermore, each four (4) main bodies 22 of the respective MOSFETs 21 come into contact with each of both abutment faces 23e of the heat transfer unit 23, which are contiguous with and parallel in a longitudinal direction to the first fixing face 23a of the heat transfer unit 23, via the silicone sheet 24. To be specific, heat radiating portions 22a (shown in FIG. 4) provided on the main bodies 22 of the respective MOSFETs 21 come into contact with the heat transfer unit 23 with the silicone sheet 24 being interposed therebetween. Note that no MOSFET 21 comes into contact with both side faces 23f orthogonal to the longitudinal direction of the heat transfer unit 23 and the power circuit board 18.

The main bodies 22 of the respective MOSFETs 21 are pressed and fixed to the heat transfer unit 23 by means of angle materials 25 as a fixing material with the silicone sheet 24 being interposed therebetween. To be specific, heat radiating portions 22a provided in the main bodies 22 of the respective MOSFETs 21 come into contact with the angle materials 25 with the silicone sheet 24 being interposed therebetween. The angle materials 25 are made of an aluminum alloy similar to the heat transfer unit 23 and, as shown in FIG. 4, are formed into longitudinally elongate bodies having an L-shaped consistent cross section. The angle materials 25 are then fixed to the heat transfer unit 23 without coming into contact with the front face 16b of the heat radiating duct 16.

The silicone sheet 24, which is interposed between the respective MOSFETs 21 and the heat transfer unit 23 and between the heat transfer unit 23 and the power circuit board 18, is an insulation sheet having high thermal conductivity (for example, a heat radiating sheet commercially available from SHINETSU CHEMICALS). As shown in FIG. 4, the silicone sheet 24 comprises a rectangular central portion 26 sized so as to cover the first fixing face 23a of the heat transfer unit 23, longer-side wing portions 27 provided along longer sides of the central portion 26 and shorter-side wing portions 28 provided similarly along shorter sides of the central portion 26.

Provided in the central portion 26 are first through holes 26a corresponding to the first fixing holes 23c in the heat transfer unit 23 and second through holes 26b corresponding to second fixing holes 23d in the heat transfer unit 23.

The respective longer-side wing portions 27 comprise a first wing portions 27a, a second wing portions 27b and a third wing portions 27c from the central portion 26 toward the outside in that order. In addition, the respective shorter-side wing portions 28 are provided with folded portions 28a on both sides thereof.

Referring to FIGS. 5 to 9, an assembling process of the MOSFET mounting structure will be described below.

Figure 5:
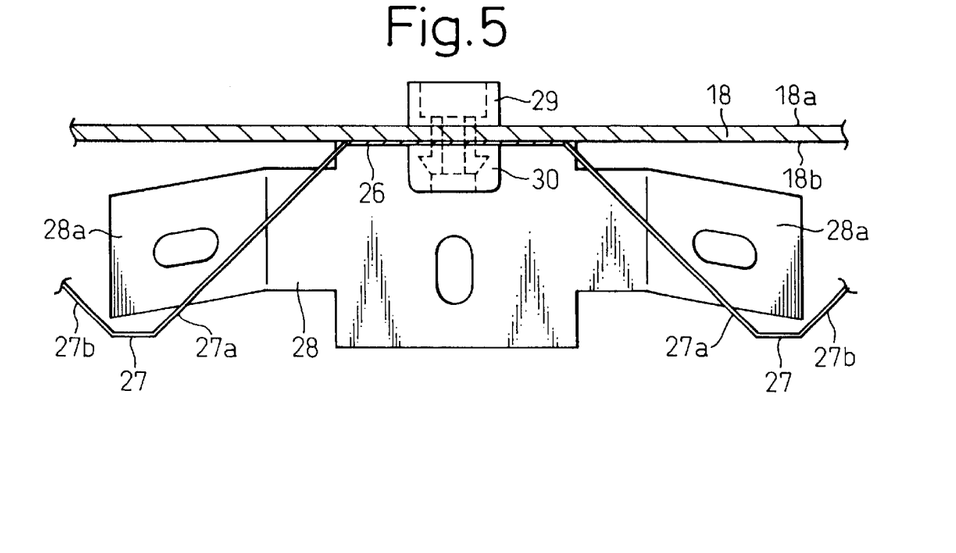
FIG. 5 is a front view showing an assembling process of the MOSFET mounting structure.

As shown in FIG. 5, in mounting a MOSFET 21, first the central portion 26 of the silicone sheet 24 disposed on the back face 18b of the power circuit board 18 is fixed to the back face 18b of the circuit board 18 by inserting a first fixing member 29, which comes into contact with the front face 18a of the power circuit board 18, into a second fixing member 30 adapted to be inserted into each of the second fixing holes 23d in the heat transfer unit 23.

Figure 6:
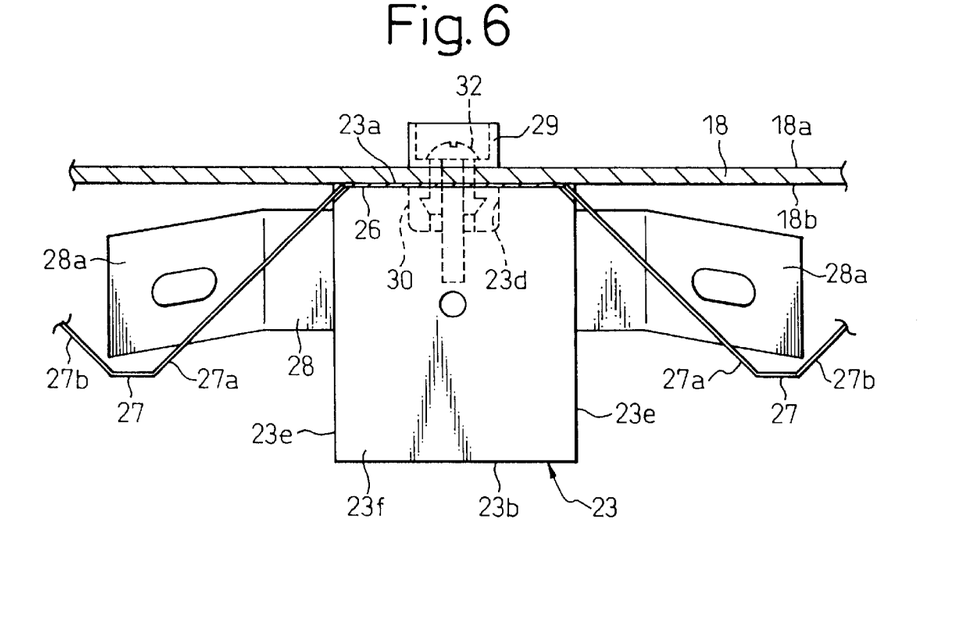
FIG. 6 is similarly a front view showing the assembling process.

Next, as shown in FIG. 6, as well as the second fixing member 30 being inserted into each of the second fixing holes 23d in the heat transfer unit 23, a fixing screw 32 penetrating through the first fixing member 29 fixed to the power circuit board 18 and the second fixing member 30 is then screwed into each of female-threaded holes formed in bottom faces of the respective second fixing holes 23d, so that the heat transfer unit 23 is fixed to the back face 18b of the circuit boar 18 with the central portion 26 of the silicone sheet 24 being interposed therebetween.

Figure 7:
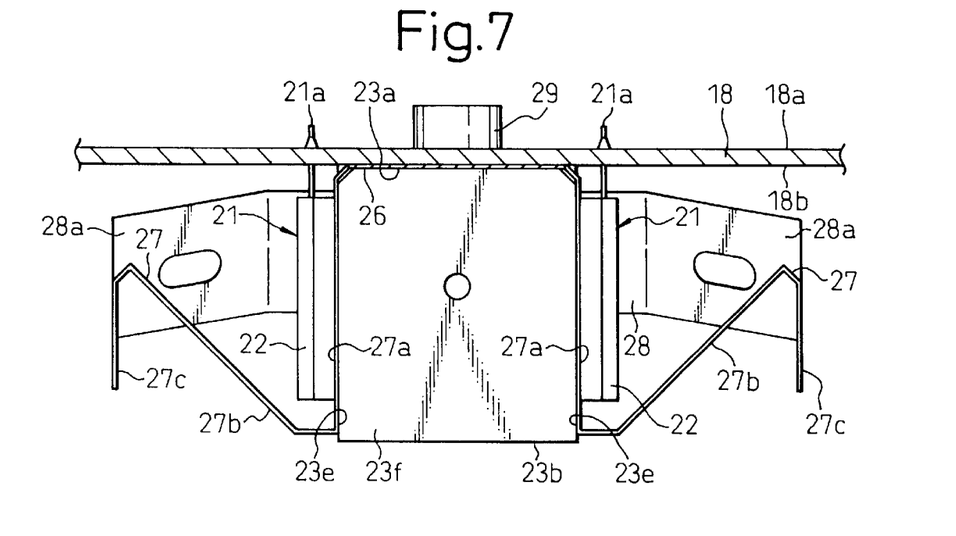
FIG. 7 is similarly a front view showing the assembling process.

Next, as shown in FIG. 7, with the respective longer-side wing portions 27 of the silicone sheet 24 being folded downward so as to enable the first wing portions 27a to come into contact with the respective abutment faces 23e of the heat transfer unit 23, the respective MOSFETs 21 are mounted to the back face 18b of the power circuit board 18 by soldering the terminals 21a thereof. Thus, the main bodies 22 of the respective MOSFETs 21 come into contact with the respective abutment faces 23e of the heat transfer unit 23 via the first wing portions 27a.

Figure 8:
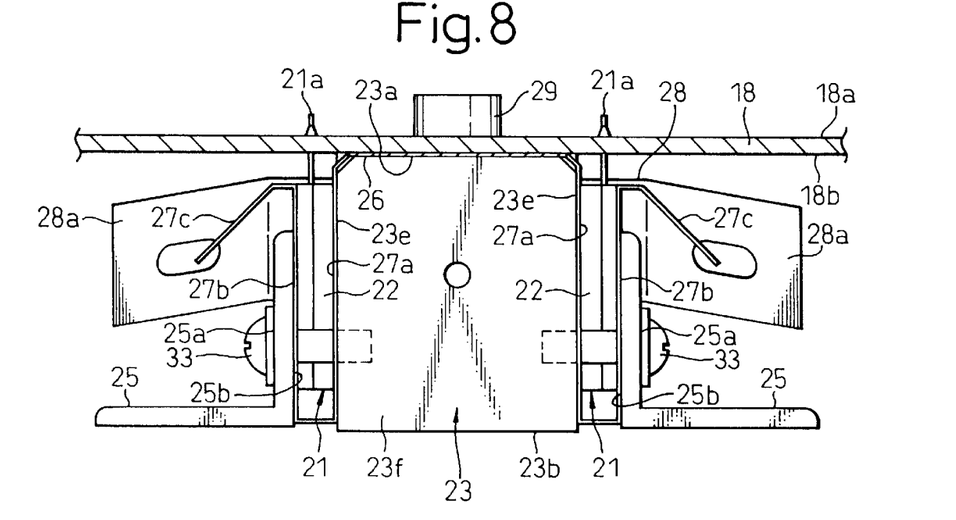
FIG. 8 is similarly a front view showing the assembling process.

Next, as shown in FIG. 8, with the respective longer-side wing portions 27 being folded back upward so that the second wing portions 27b are interposed between the respective MOSFETs 21 and the angle materials 25, the respective angle materials 25 are fixed to the heat transfer unit 23 by fixing screws which screw into the eat transfer unit 23. When this occurs, the main bodies 22 of the respective MOSFETs 21 come into contact with abutment sides 23e of the heat transfer unit 23 via the first wing portions 27 in a state in which the main bodies 22 of the respective MOSFETs 21 are pressed against the angle materials 25 via the second wing portions 27b upwardly folded back.

Figure 9:
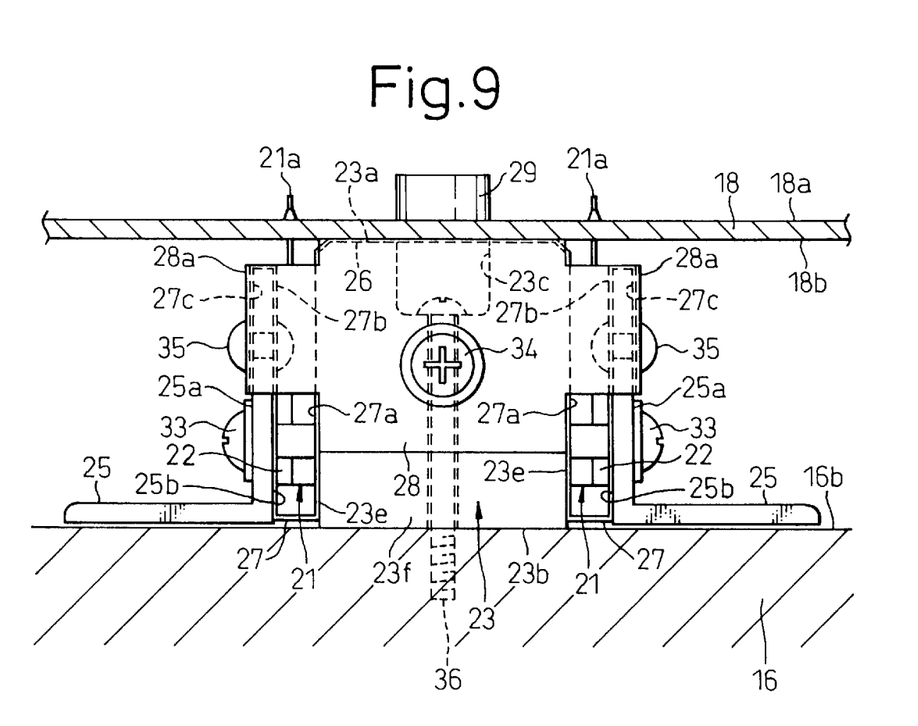
FIG. 9 is similarly a front view showing the assembling process.

Next, as shown in FIG. 9, each shorter-side wing portions 28 of the silicone sheet 24 are folded downward and are then fixed with fixing screws 34 which are screwed into respective side faces 23f of the heat transfer unit 23. Furthermore, the respective longer-side wing portions 27 are then folded back downward and the third wing portions 27c come into contact with the external faces 25a of the angle materials 25 as well as the respective folded portions 28a of the respective shorter-side wing portions 28 come into contact with an external faces 25a of the angle materials 25 from the outside of the third wing portions 27c. Then, the folded portions 28a and the third wing portions 27c superposed on the external faces 25a of the angle members 25 are interposed together with the second wing portions 27b, which come into contact with an internal faces 25b of the angle materials 25, with nylon rivets 35 penetrating through the angle materials 25. Finally, the second fixing face 23b of the heat transfer unit 23 is pressed to contact with the front face 16b of the heat radiating duct 16 by screwing fixing screws 36, inserted from holes 18c formed in the power circuit board 18 through into the respective first fixing holes 23c of the heat transfer unit 23 into the heat radiating duct 16.

Next, the function and effects of the semiconductor mounting structure constructed as described above will be described.

(1) Heat generated at the main bodies 22 of the respective MOSFETs 21 is transferred to the heat transfer unit 23 via the silicon sheet 24 and then to the heat radiating duct 16, against which the heat transfer unit 23 is brought into press contact, whereby the heat so transferred is then radiated. Thus, when compared with the conventional mounting structure where heat from MOSFETs is radiated by a heat radiating unit directly connected onto the power circuit board 18, since in the present invention the heat from the MOSFETS 21 is radiated by means of the heat radiating duct 16 which can be provided irrespective of the mounting area on the power circuit board 18 and has a large heat radiating capacity, the heat radiating capacity per mounting area for mounting the heat transfer unit 23 on the power circuit board 18, which replaces the conventional heat radiating units, becomes higher.

As a result of this, the cooling efficiency of the respective MOSFETs 21 relative to the mounting area on the power circuit board 18 can be improved, whereby the respective MOSFETs 21 can be further cooled or, by increasing the mounting density of a plurality of MOSFETS 21, it is possible to miniaturize the power circuit boards 18.

In addition, in the feeding-side charger 10 electromagnetic induction system, the main body of the charger can be miniaturized by miniaturizing the power circuit board 18.

(2) When there occurs a failure in a main bodies 22 of the MOSFETs 21, the respective MOSFETs 21 are insulated from the heat radiating duct 16 with the silicone sheet 24 having insulating properties and interposed between the respective MOSFETs 21 and the heat transfer unit 23. Therefore, even if there occurs a failure in the MOSFET 21, no electric current is allowed to flow through the heat radiating duct 16.

(3) The silicone sheet 24 interposed between the heat transfer unit 23, with which the main bodies 22 of the respective MOSFETs 21 come into contact, and the angle material 25 are provided so as to come into contact with the abutment face 23e of the heat transfer unit 23 and the internal face of the angle material 25 over a more sufficiently wide area range than the area range of the contact areas of the main bodies 22. Therefore, the shortest creepage distance along the surface of the silicone sheet 24 between the respective MOSFETs 21 and the heat transfer unit 23 and between the respective MOSFETs 21 and the angle materials 25 becomes remarkably longer than the shortest distances between the respective MOSFETs 21 and the heat transfer unit 23 and between the respective MOSFETs 21 and the angle materials 25. As a result of this, if there occurs a failure in the MOSFET 21, surface discharge via the silicone sheet 24 hardly occurs, so that it is difficult for electric current to flow through the heat radiating duct 16 or the angle material 25. Due to this, even if the mounting density of the respective MOSFETs 21 on the power circuit board 18 is increased, superior insulating properties can be secured.

(4) Heat generated in the main bodies 22 of molded type MOSFETs is efficiently transferred, to the heat transfer unit 23, from the main bodies 22 which are pressed against the heat transfer unit 23 by the angle material 25 fixed to the heat transfer unit 23 and come into contact with the heat transfer unit 23. Thus, in a case where molded type MOSFETs are used, the heat radiating capacity per mounting area for mounting the heat transfer unit 23 on the power circuit board 18 can be increased.

(5) The plurality of molded type MOSFETs in the same numbers are arranged to come into contact with each of the longitudinally parallel abutment faces 23e, respectively, which are contiguous with the first fixing face 23a of the rectangular prism-like heat transfer unit 23 extending along the power circuit board 18. In this case, the mounting area of the heat transfer unit relative to the cooling capacity of the respective MOSFETs 21 becomes smaller than in a case where a plurality of MOSFETs 21 are arranged to come into contact with respective side faces orthogonal to the power circuit board 18 in a disk-like or regular polygonal heat transfer unit with a center axis perpendicular to the power circuit board 18. Thus, the combined mounting areas of those of the plurality of MOSFETs 21 plus the heat transfer unit 23 become smaller. As a result of this, a plurality of MOSFETs 21 can be mounted within a minimized mounting area.

Embodiments other than those described above, embodying the present invention, are listed below.

In the above embodiment, the heat transfer unit is not limited to the rectangular prism-like heat transfer unit on which the main bodies of the plurality of molded type semiconductor come into contact with the respective longitudinally parallel side faces. Alternatively, for example, a heat transfer unit may be formed into shapes such as a disk-like or regular polygonal shape having a central axis perpendicular to the power circuit board 18, in which main bodies of a plurality of molded type semiconductors may come into contact with respective peripheral faces orthogonal to the power circuit board 18. In this case, also, the cooling efficiency of the molded type semiconductor devices can be improved.

The semiconductors are not limited to power MOSFETs but it may be possible to use power semiconductor devices such as bi-polar power transistors, IGBTs, rectifier devices, thyristors, GTO thyristors, light-triggered thyristors, TRIACs and SITs. In addition, the present invention may be applied to a mounting structure for semiconductor devices other than power semiconductor devices.

The present invention may not only be applied to the mounting structure of molded type semiconductor devices, but also applied to those of can-type semiconductor devices.

The circuit board applied to the semiconductor mounting structure of the invention, in the electromagnetic induction system feeding-type charger, is not limited to the power circuit board 18 in which the power conversion circuit for converting a commercial alternating current into a high frequency alternating current is provided. The present invention may be applied to a mounting structure for any circuit board with semiconductor devices mounted, such as a mounting structure for power semiconductor devices in a power circuit board in which a three-phase inverter circuit is included for generating an alternating current of a predetermined frequency from a direct current in a forklift truck adapted to run or perform loading and unloading operations with a direct current power source fed from batteries.

According to the first to fifth aspects of the present invention, the cooling efficiency of semiconductor devices relative to the mounting area on the circuit board can be improved so as to increase the mounting density.

In addition, according to the second to fifth aspects of the present invention, no electric current is allowed to flow to the heat radiating unit side when there occurs a failure in the semiconductor device and, moreover, the superior insulating properties can be secured even if the mounting density is increased.

In addition, according to the fifth aspect of the present invention, the entirety of the charger can be miniaturized by miniaturizing the circuit board. While the invention has been described by reference to specific embodiments chosen for the purposes of illustration, it should be apparent that numerous modifications could be made thereto by those skilled in the art without departing from the basic concept and scope of the invention.

I claim:

1. A semiconductor device mounting structure, wherein a heat transfer unit is fixed to a circuit board on which molded-type semiconductor devices are mounted, said heat transfer unit coming into contact with a heat radiating unit provided contiguous with said circuit board, and wherein main bodies of said semiconductor devices mounted on said circuit board are pressed against said heat transfer unit by means of a fixing member that is fixed to said heat transfer unit.

2. A semiconductor device mounting structure, as set forth in claim 1, wherein an insulation sheet having thermal conductivity is interposed between said heat transfer unit and said semiconductor devices.

3. A semiconductor device mounting structure, as set forth in claim 1, wherein said heat transfer unit is formed into a rectangular prism-like shape extending along said circuit board and has longitudinally parallel side faces thereof, contiguous with a fixing face which comes into contact with said circuit board, to be abutment faces for said semiconductor devices, and wherein same numbers of said semiconductor devices come into contact with each of said abutment faces respectively.

4. A semiconductor device mounting structure that is part of a feeding-side charger, comprising:

a heat transfer unit fixed to a circuit board on which a power conversion circuit including semiconductor devices is formed, said heat transfer unit coming into contact with a heat radiating duct provided contiguous with said circuit board such that said circuit board is parallel with one side of said heat radiating duct;

wherein main bodies of said semiconductor devices mounted on said circuit board come into contact with said heat transfer unit; and wherein said power conversion circuit converts a commercial alternating current into a high-frequency alternating current.

5. A semiconductor device mounting structure, as set forth in claim 2, wherein said heat transfer unit is formed into a rectangular prism-like shape extending along said circuit board and has longitudinally parallel side faces thereof, contiguous with a fixing face which comes into contact with said circuit board, to be abutment faces for said semiconductor devices, and wherein same numbers of said semiconductor devices come into contact with each of said abutment faces respectively.

* * * * *

UNITED STATES PATENT AND TRADEMARK OFFICE
CERTIFICATE OF CORRECTION

PATENT NO.    : 6,426,874 B2
DATED         : July 30, 2002
INVENTOR(S)   : Katsuyuki Kajiura It is certified that error appears in the above-identified patent and that said Letters Patent is hereby corrected as shown below:

Column 4,
Line 66, "boar" should be -- board --

Column 5,
Line 17, "east" should be -- heat --

Column 7,
Line 65, after "board" the next sentence should start a paragraph
-- While this invention…" --

Signed and Sealed this

Thirty-first Day of December, 2002

JAMES E. ROGAN
*Director of the United States Patent and Trademark Office*